United States Patent
Wei

[19]

[11] Patent Number: 6,074,950
[45] Date of Patent: Jun. 13, 2000

[54] ALIGNMENT STRATEGY FOR ASYMMETRICAL ALIGNMENT MARKS

[75] Inventor: Chi-Hung Wei, Hsinchu, Taiwan

[73] Assignee: United Integrated Circuits Corp., Hsinchu, Taiwan

[21] Appl. No.: 09/234,976

[22] Filed: Jan. 22, 1999

[30] Foreign Application Priority Data

Oct. 31, 1998 [TW] Taiwan .................................. 87118123

[51] Int. Cl.⁷ .................................................. H01L 21/00
[52] U.S. Cl. .............................. 438/692; 438/8; 438/747; 216/84; 216/88; 216/85
[58] Field of Search .................................. 438/8, 691, 693, 438/692, 745, 747; 216/38, 84, 85, 88, 91; 156/345 LC, 345 LP

[56] References Cited

U.S. PATENT DOCUMENTS 5,972,798  10/1999  Jang et al. .......................... 216/84 X

*Primary Examiner*—William Powell
*Attorney, Agent, or Firm*—Jiawei Huang; J.C. Patents

[57] ABSTRACT

An alignment strategy for asymmetrical alignment marks in a wafer, in which the positions of the a symmetrical alignment marks are determined twice. A first set of positions is detected after a chemical-mechanical polishing step. A second set of positions is detected after a rotation in which the wafer is rotated by 180° in the plane of the surface of the wafer.

5 Claims, 2 Drawing Sheets

ALIGNMENT STRATEGY FOR ASYMMETRICAL ALIGNMENT MARKS

CROSS-REFERENCE TO RELATED APPLICATION

This application claims the priority benefit of Taiwan application Ser. No. 87118123, filed Oct. 31, 1998, the full disclosure of which is incorporated herein by reference.

BACKGROUND OF THE INVENTION

1. Field of the Invention

This invention relates to an alignment strategy of alignment marks, and more particularly, to corrections for shifts of alignment marks.

2. Description of Related Art

Nearly all very-large-scale-integration (VLSI) and ultra-large-scale-integration (ULSI) circuits are made with multilevel metallization. It provides greater flexibility in circuit design. As more and more layers are added in an integrated circuit (IC) process, planarization of the IC topography in intermediate steps is required. This is because non-planar surfaces interfere with the optical resolution of subsequent photolithography steps.

One way to planarize the IC topography is to use a global planarization techniques such as chemical-mechanical polishing (CMP). A problem with the CMP is that it often makes the step heights too shallow in situations where the step heights are alignment marks used in the subsequent photolithography steps. Fortunately, solutions to this problem such as a clearout window method and an alignment mark segment have been already proposed.

However, there is still another problem with the CMP used in the IC topography planarization. For example, the mechanical polishing of the CMP process alters the location of the alignment marks. Thus the alignment marks, as detected by an optical alignment system, can lead to errors. These errors cause photolithography misalignments if they are not corrected.

SUMMARY OF THE INVENTION

It is an objective of the present invention to locate positions of asymmetrical alignment marks in a wafer more accurately.

In accordance with the foregoing and other objectives of the present invention, a method for locating positions of alignment marks in a wafer is provided. A left and a right alignment marks are symmetrically formed in a wafer. A chemical mechanical polishing (CMP) step induces alignment mark center shifts by polishing the surface of the wafer. A first and a second sets of positions of the alignment marks are detected, wherein the second set of positions is detected after a rotation in which the wafer is rotated by 180° in the plane of the surface of the wafer. By averaging the two sets of positions, the accurate positions of the alignment marks are achieved.

BRIEF DESCRIPTION OF DRAWINGS

The invention can be more fully understood by reading the following detailed description of the preferred embodiments, with reference made to the accompanying drawings wherein.

DETAILED DESCRIPTION OF PREFERRED EMBODIMENTS

Figure 1:
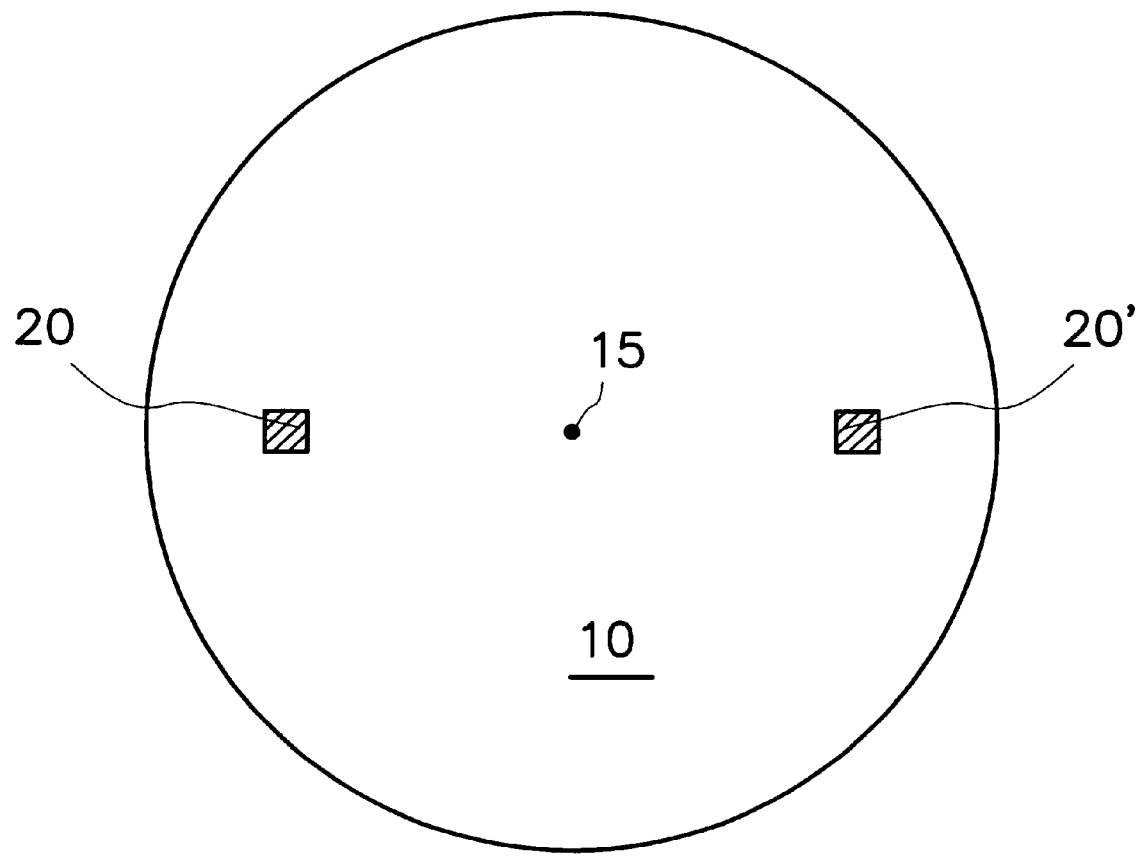
FIG. 1 is a schematic, cross-sectional view of a wafer having symmetrical alignment marks, according to a preferred embodiment of the invention.

Referring to FIG. 1 at least a left alignment mark 20 and a right alignment mark 20' are formed in a wafer 10. They are symmetrically formed around a center of inversion, i.e. the center 15 of wafer. That is, by moving through the center 15 of the wafer 10 to a position opposite the original position and as far from the center 15 as when it started, each of the alignment marks 20, 20' is identical with the other one. Assume all devices subsequently referred to in this embodiment are located with a two-dimensional, Cartesian coordinate system.

Figure 2A:
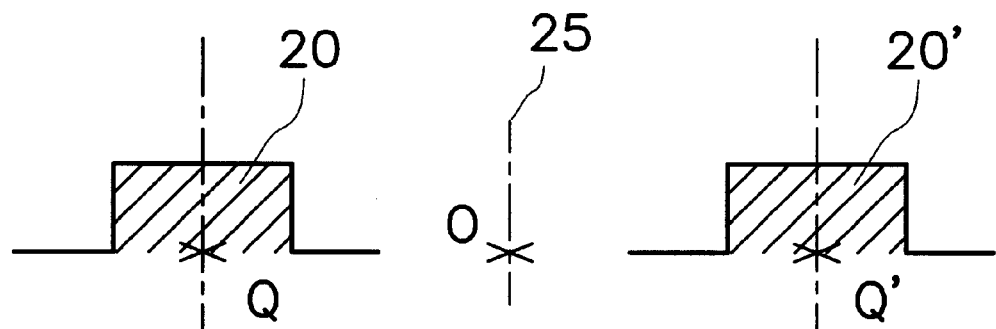
FIGS. 2A–2C are schematic, cross-sectional views of the alignment marks shown in FIG. 1 illustrating steps taken in an alignment process.

FIG. 2A is a schematic, cross-sectional view of the alignment marks shown in FIG. 1. The alignment position 25 of the wafer is determined by the positions of the alignment marks 20, 20'. Theoretically, if the normal alignment marks 20, 20' respectively have coordinates Q(X, Y) and Q'(X', Y'), the coordinates of the alignment position 25 is the center of the alignment marks, i.e.

$$O\left(\frac{X+X'}{2}, \frac{Y+Y'}{2}\right).$$

Figure 2B:
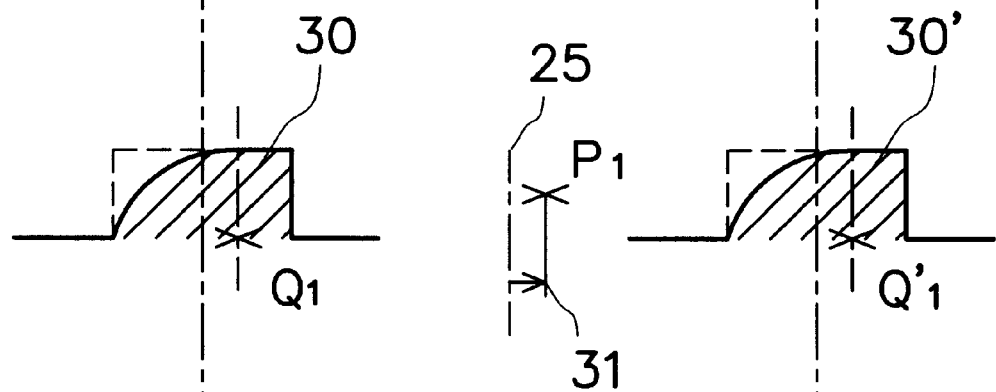

However, the alignment marks 20, 20' are often shifted by many factors. For example, chemical mechanical polishing (CMP) induces alignment mark center shifts by polishing the surface of the wafer, as shown in FIG. 2B. Because the alignment marks 20, 20' experience CMP in the same polishing direction, both of them are shifted by $+\Delta x$ in the x-axis direction, and $+\Delta y$ in the y-axis direction. The shifted alignment marks 30, 30' lose their symmetry, i.e. they are not identical after the inversion operation through the center of the wafer.

Thus, a two-steps alignment method is provided to eliminate the CMP factor. In the initial step, the left alignment mark 30 is detected to have coordinates $Q_1(X+\Delta x, Y+\Delta y)$, and the right alignment mark 30' is detected to have coordinates $Q_1'(X'+\Delta x, Y'+\Delta y)$. The first center point 31 of the alignment marks 30, 30' has coordinates $$P_1\left(\frac{X+X'}{2}+\Delta x, \frac{Y+Y'}{2}+\Delta y\right)$$

which is different from the coordinates $$O\left(\frac{X+X'}{2}, \frac{Y+Y'}{2}\right)$$

of the normal alignment position 25.

Figure 2C:
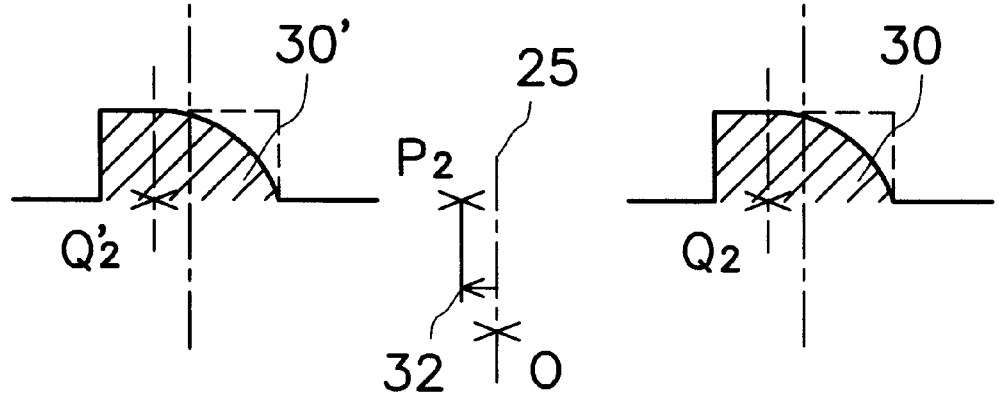

Referring to FIG. 2C, the wafer is rotated in the plane of the surface of the wafer, wherein the plane is parallel with the Cartesian coordinate plane. After rotating the wafer by 180°, the positions of the alignment marks 30, 30' are detected again. The new, left alignment mark 30' is detected to have coordinates $Q_2(X-\Delta x, Y-\Delta y)$ and the new right alignment mark is detected to have coordinates $Q_2(X'-\Delta x, Y'-\Delta y)$. By averaging the coordinates $Q_1$ and $Q_2'$, the shift error $(\Delta x, \Delta y)$ can be eliminated, and the correct coordinates of the normal left alignment mark 20 (shown in FIG. 2A) are found to be $Q(X, Y)$. In a similar way, the correct coordinates of the normal right alignment mark 20' (shown in FIG. 2A) are found to be $Q'(X', Y')$ by averaging the coordinates $Q_2$ and $Q_1'$.

In addition. the second center point 32 of the new alignment marks 30, 30' has coordinates $$P_2\left(\frac{X+X'}{2} - \Delta x, \frac{Y+Y'}{2} - \Delta y\right).$$

By averaging the coordinates $P_1$ and $P_2$, the correct coordinates of the normal alignment position 25 (shown in FIG. 2A) are found to be $$O\left(\frac{X+X'}{2}, \frac{Y+Y'}{2}\right).$$

The two-steps alignment method for locating the normal positions is named for the dual alignment method. It applies to two or even more asymmetrical alignment marks in a wafer, wherein the alignment marks are originally symmetrical with each other but are made asymmetrical by CMP. In accordance with this invention, the dual alignment method creates a new set of coordinate data which reverses the initial set of coordinate data. The normal positions obtained by averaging the two sets of coordinate data provides a higher accuracy of pattern registration than ever.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of locating positions of alignment marks in a wafer, comprising:

detecting a first set of the alignment mark positions;

rotating the wafer by 180° in the plane of the surface of the wafer; and detecting a second set of alignment mark positions.

2. The method of claim 1, which further comprising a chemical-mechanical polishing step before detecting a first set of alignment marks positions.

3. The method of claim 1, wherein the alignment marks comprise at least two symmetrical alignment marks.

4. The method of claim 3, wherein each of the symmetrical alignment marks is identical with the other one by moving through the center of the wafer to a position opposite the original position and as far from the center as when it started.

5. The method of claim 1, which further comprises:

averaging the first set of positions to obtain a first center position;

averaging the second set of positions to obtain a second center position; and averaging the first and the second center positions to obtain a position as the alignment position of the wafer.

* * * * *